United States Patent
Perdoor et al.

(10) Patent No.: US 7,358,801 B2
(45) Date of Patent: Apr. 15, 2008

(54) REDUCING NOISE AND/OR POWER CONSUMPTION IN A SWITCHED CAPACITOR AMPLIFIER SAMPLING A REFERENCE VOLTAGE

(75) Inventors: Sandeep Mallya Perdoor, Bangalore (IN); Visvesvaraya A Pentakota, Bangalore (IN); Ravishankar S Ayyagari, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 90 days.

(21) Appl. No.: 11/161,486

(22) Filed: Aug. 5, 2005

(65) Prior Publication Data
US 2006/0033561 A1 Feb. 16, 2006

Related U.S. Application Data

(60) Provisional application No. 60/601,900, filed on Aug. 16, 2004.

(51) Int. Cl.
*H03F 1/02* (2006.01)
(52) U.S. Cl. ......................................... 330/9
(58) Field of Classification Search ............... None
See application file for complete search history.

(56) References Cited

U.S. PATENT DOCUMENTS

| | | | | |
|---|---|---|---|---|
| 4,760,376 A * | 7/1988 | Kobayashi et al. | ......... | 341/155 |
| 6,249,240 B1 * | 6/2001 | Bellaouar | ................... | 341/172 |
| 6,396,429 B2 * | 5/2002 | Singer et al. | ............... | 341/155 |
| 6,433,632 B1 * | 8/2002 | Nakamura et al. | ............. | 330/9 |
| 6,445,331 B1 * | 9/2002 | Stegers | ........................ | 341/172 |
| 6,515,612 B1 * | 2/2003 | Abel | .......................... | 341/172 |
| 6,784,824 B1 * | 8/2004 | Quinn | ........................ | 341/172 |
| 6,838,930 B2 * | 1/2005 | Huynh | .......................... | 330/9 |
| 6,891,486 B1 * | 5/2005 | Pentakota et al. | .......... | 341/120 |
| 6,952,240 B2 * | 10/2005 | Gower et al. | ............... | 348/678 |
| 6,963,300 B1 * | 11/2005 | Lee | .............................. | 341/172 |
| 6,970,038 B2 * | 11/2005 | Chandrasekaran | ............. | 330/9 |
| 7,009,549 B1 * | 3/2006 | Corsi | ......................... | 341/161 |
| 7,088,273 B1 * | 8/2006 | Perdoor et al. | ............. | 341/120 |
| 7,123,301 B1 * | 10/2006 | Nakamura et al. | .......... | 348/301 |
| 2007/0046523 A1 * | 3/2007 | Wang et al. | ................ | 341/172 |

* cited by examiner

*Primary Examiner*—Robert Pascal
*Assistant Examiner*—Krista M Flanagan
(74) *Attorney, Agent, or Firm*—Wade J. Brady, III; Frederick J. Telecky, Jr.

(57) ABSTRACT

Equal common mode voltage is present at the input terminals of an operational amplifier with amplifies the residue signal in a stage of an ADC in two phases while reducing the noise introduced into the amplified signal. A reference capacitor is coupled between an input terminal of the operational amplifier and a reference voltage in a first phase, and between the input terminal and a the reference voltage but with opposite polarity in the second phase.

12 Claims, 8 Drawing Sheets

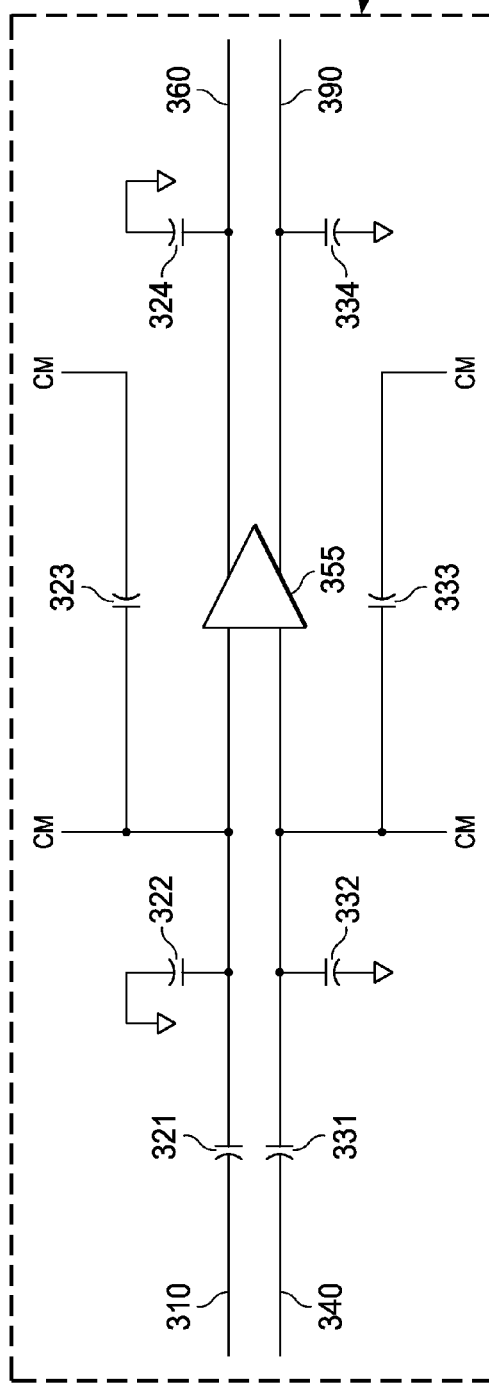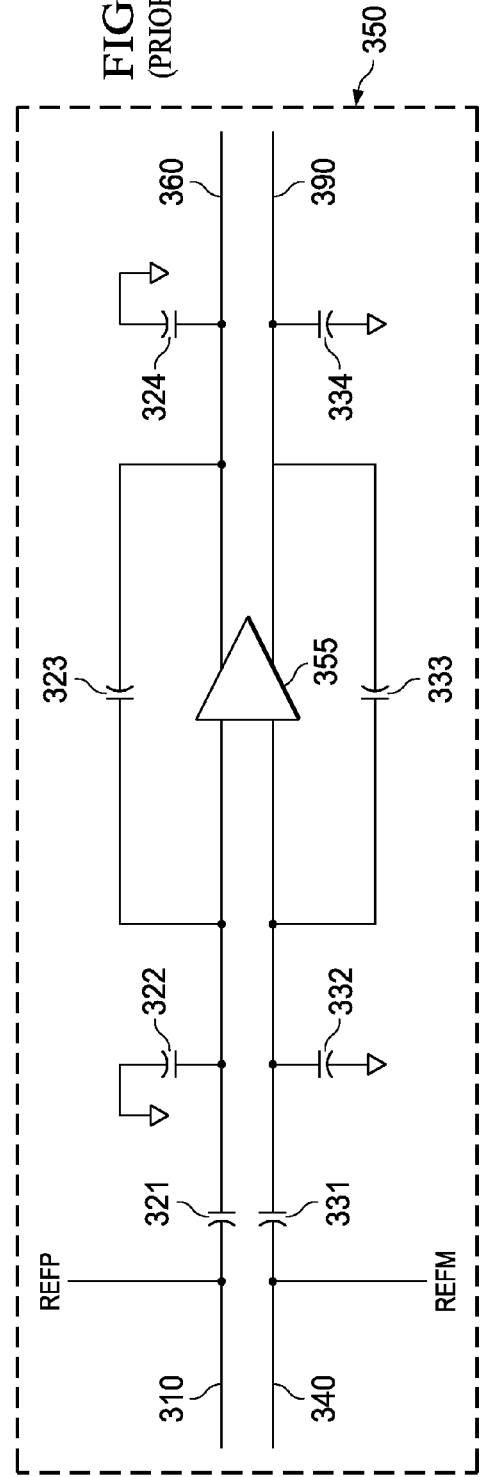

US 7,358,801 B2

REDUCING NOISE AND/OR POWER CONSUMPTION IN A SWITCHED CAPACITOR AMPLIFIER SAMPLING A REFERENCE VOLTAGE

RELATED APPLICATION

The present application claims priority from the copending U.S. Provisional Patent Application entitled, "Technique to sample reference voltage to reduce thermal noise in switched capacitor amplifiers", Ser. No. 60/601,900, filed Aug. 16, 2004, the entirety of whith is incorporated by reference herein.

BACKGROUND

1. Field of the Invention

The present invention relates to integrated circuit design, and more specifically to a method and apparatus for reducing noise in a switched capacitor amplifier circuit sampling a reference voltage.

2. Related Art

Amplifier circuits (amplifiers) are often employed to amplify signals. In general, an amplifier amplifies an input signal and provides the amplified signal as an output signal. A switched capacitor amplifier is a type of amplifier circuit, which contains operational amplifier(s) (op-amp), switches and capacitors driven by clock signals. The switches are operated to control the connections and attain the desired amplification, as is well known in the relevant arts.

Switched capacitor amplifiers are used in various environments, and an analog to digital converter (ADC) represents an example apparatus in which switched capacitor amplifiers are implemented. An example ADC implementing a switched capacitor amplifier is described below with reference to FIG. 1.

FIG. 1 is a block diagram of an example pipeline ADC implementing a switched capacitor amplifier according to a prior approach. ADC 100 is shown containing sample and hold amplifier (SHA) 110, stages 120-1 through 120-S and digital error correction block 130. Each block is described below in further detail.

SHA 110 samples an input signal received on path 134 and holds the voltage level of the sample for further processing. Each stage 120-1 through 120-S generates a sub-code corresponding to a voltage level of an analog signal received as an input, and an amplified residue signal as an input to a (any) next stage. Digital error correction block 130 receives sub-codes from the various stages, and generates a digital code (on path 146) corresponding to the sample received on path 134.

FIG. 2 further illustrates the logical operation of each stage (described with reference to stage 120-1 only, for conciseness) according to a prior approach. Stage 120-1 is shown containing flash ADC 250, digital to analog converter (DAC) 260, subtractor 270 and gain amplifier 280. Flash ADC 250 (an example of a quantizer) converts a sample of an analog signal received on path 111 into a corresponding P-bit sub-code provided on path 256. DAC 260 converts the sub-code received on path 256 into corresponding analog signal (Vdac) on path 267.

Subtractor 270 generates a residue signal as the difference of sample 111 (Vi) and the analog signal received on path 267 (Vdac). Gain amplifier 280 amplifies the residue signal (Vi−Vdac), which is provided on path 112 as an amplified residue signal. The signal on path 112 is used to resolve the remaining bits in the N-bit digital code by the subsequent ADC stages.

The subtractor, DAC, and gain amplifier may be implemented using a capacitor network and an operational amplifier, together operating as a switched capacitor amplifier. One prior switched capacitor amplifier implementing subtractor 270, DAC 260, and gain amplifier 280 of stage 120-1 is described below with respect to FIGS. 3A-3D.

FIG. 3A is a circuit diagram of a prior switched capacitor amplifier implementing subtractor 270, DAC 260, and gain amplifier 280 of stage 120-1. Switched capacitor amplifier 350 is shown containing op-amp 355, capacitors 321-324 and 331-334, and switches 311-315 and 341-345. The operation of the components is described below in further detail.

The circuit in FIG. 3A operates in two phases according to clock signals 370 and 390 shown in FIG. 3D. Stage 350 operates to sample the signals received on inputs 310 and 340 in phase one (sample phase between time points 371 and 372), and amplify and hold the sampled signal in phase two (hold phase between time points 391 and 392). The desired operations in the two phases are obtained by operating various switches, as described below with reference to FIGS. 3B and 3C respectively.

FIG. 3B is a circuit diagram depicting the operation of phase 1 in which switches 311, 313, 314, 341, 343 and 344 are closed (making contact) and switches 312, 31 5, 342 and 345 are kept open. For clarity and conciseness, the portions of the circuit not connected due to the open switches and not necessary for an understanding of the circuit operation, are not shown.

Capacitors 321 and 331 are charged to store a charge proportionate to the differential input signal received on paths 310 and 340 (due to the closing of switches 311 and 341). Capacitors 323 and 333 discharge the charges accumulated (e.g., from a previous phase operation) due to closing of switches 313, 314, 343, and 344.

FIG. 3C is a circuit diagram depicting operation of phase 2 (of the circuit diagram of FIG. 3A) in which switches 312, 315, 342 and 345 are closed (making contact) and switches 311, 313, 314, 341, 343 and 344 are kept open. One of the terminals of capacitors 321 and 331 gets connected to the reference input REFP and REFM, respectively, due to operation of switches 312 and 342.

Capacitors 321 and 331 discharge (pump) a charge proportionate to the difference of the sampled voltage and the reference voltage (residue signal) into capacitors 323 and 333, respectively. Due to the operation of switches 315 and 345, voltage developed across capacitors 323 and 333 appears at the output terminals 360 and 390 respectively. The ratio of the capacitance values of the feedback capacitor and the sampling capacitor determines the amplification factor (gain) of the residue signal (from the principle Q=CV). The amplified residue signal is provided to the next stage (120-2) on path 112.

One recognized disadvantage with approach described above is that the common mode voltage (well known in relevant art) at the input of op-amp 355 may potentially be different during phase 1 and phase 2, if sources (not shown) of input (310, 340) and reference voltages (REFP and REFM) connected to the capacitors (321, 331) have different common mode voltages. As a result, the operating point (bias point) of the operational amplifier may drift from phase 1 operation to phase 2 operation, resulting in an error or non-linearity in the digital bits generated.

In one prior approach, such an error/non-linearity is reduced by ensuring the common mode voltage of the reference signal (between time point 391-392) equals the common mode voltage of the input signal sampled between corresponding time points (371-372). However, such equality of common mode voltages may not be obtained under various operating conditions. For example, the common mode voltage of the input signal may dynamically vary on the time scale, based on the nature of the input signal being sampled.

Accordingly, the input signal and the reference voltages may be sampled together to reduce the error/non-linearity due to the difference in common mode voltage. One prior embodiment sampling both input signal and the reference voltages is described below with reference to FIGS. 4A-4C.

FIG. 4A is a circuit diagram of a prior switched capacitor amplifier, which samples an input signal and a reference signal together. Circuit 400 is shown containing capacitors 421-424, 431-434, 461 and 462, switches 411-416, 441-445, 471, 472 and 475, and op-amp 450. The operation of the components is described below in further detail.

Circuit 400 operates in two phases according to clock signals 370 and 390 shown in FIG. 3D. Broadly, in phase 1 (between time points 371-372), capacitors 421 and 431 sample an input signal and capacitors 461 and 462 sample a reference signal. In phase 2 (between time points 391-392), the difference of sampled input voltage and reference voltage (residue signal) is amplified. The desired operations in the two phases are obtained by operating various switches, as described below with reference to FIGS. 4B and 4C respectively.

FIG. 4B is a circuit diagram depicting the operation of circuit 400 in phase 1 (duration 371-372) in which switches 411, 471, 413, 414, 441, 472, 443 and 444 are closed (making contact) and switches 412, 415, 442, 445, 416 and 475 are kept open. As a result, each of capacitors 421 and 431 is connected between the input signal and a common mode reference CM, each of capacitors 461 and 462 is connected between the reference voltage and common mode voltage CM, and both terminals of each of capacitors 423 and 433 are connected to common mode reference CM as shown.

Due to such connections, each of capacitors 421 and 431 stores a charge proportionate to the sampled differential input signal (as desired and noted above), each of capacitors 461 and 462 stores a charge proportionate to the reference voltage (REFP and REFM), and each of capacitors 423 and 433 discharges any (residue) charge accumulated in the previous phase of operation.

FIG. 4C is a circuit diagram depicting the operation of circuit 400 in phase 2 (391-392) in which switches 412, 415, 442, 445, 416 and 475 are closed (making contact) and switches 411, 471, 413, 414, 441, 472, 443 and 444 are kept open. As a result, charges stored in the capacitors 421, 461, 431 and 462 are transferred to the feedback capacitor 423, 433.

The output voltage generated at the output of op-amp 450 is given by:

$$Vout = Voutp - Voutm = \frac{Cs1}{Cf} \times (Vinp - Vinm) - \frac{Cs2}{Cf}(REFP - REFM) \quad \text{Equation (1)}$$

wherein Cs1 represents the capacitance value of each capacitor 421 and 431, Cs2 represents the capacitance value of each capacitor 461 and 462, and Cf represents the capacitance value of each capacitor 423 and 433. Vout in Equation 1 represents an amplified residue signal provided to stage 120-2 on path 112 at time point 392.

As may be appreciated from the above, the common mode voltage at the input of the amplifier remains the same in both phase 1 and phase 2 since capacitor pairs 461/462 and 421/431 maintain the same common mode at their respective inputs. This, in turn, is because capacitors 421 and 431 sample input during phase1 and are shorted during phase2. The same applies for capacitors 461 and 462 also. In contrast, in the embodiments of FIGS. 3A-3C, the input signal voltages were maintained in phase 1 and the reference signal was connected in phase 2.

Continuing with reference to FIGS. 4A-4C, since the common mode voltage at the input terminals of the op-amp is maintained equal in both phase 1 and phase 2, the error/non-linearity is reduced in circuit 400 as against circuit 350.

However, due to addition of capacitors 461 and 462, additional noise is introduced by a stage implementing the switched capacitor amplifier of circuit 400. Accordingly, the noise power generated by the circuit of FIG. 4A, as measured at the input of circuit 400 is at least approximately given by:

$$N_{pl} = \frac{2KT}{C_{S1}} + \frac{2KT}{C_F} \times \left(\frac{C_F}{C_S}\right)^2 + \frac{2KT}{C_{S2}} \times \left(\frac{C_{S2}}{C_{S1}}\right)^2 + \\ \frac{4}{3} \times (1+\alpha) \times \frac{KT}{C_L} \times \frac{1}{\beta} \times \frac{1}{G^2} + (VN_{REF})^2 \times \left(\frac{C_{S2}}{C_{S1}}\right)^2 \quad \text{Equation (2)}$$

wherein a represents a ratio of transconductance of all noise contributing transistors in the amplifier (not shown in the figures) to transconductance of input transistors of the amplifier, CL represents the total load at the output of the amplifier, VNref represents the noise in the reference voltage, G represents a loop gain of the amplifier (equal to a ratio of the capacitance values of feedback capacitor 421 to sampling capacitor 431), K represents a Boltzmann constant, T represents ambient temperature, (as is well known in the relevant arts) and β represents a feedback factor of op-amp and equal of capacitance value of feedback capacitor to the sum of the capacitance values of all the capacitors connected to input terminals of the op-amp, given by:

$$\beta = \frac{C_F}{C_{S1} + C_{S2} + C_F + C_{PIN}} \quad \text{Equation (3)}$$

wherein $C_{PIN}$ represents a total parasitic capacitor at the input of op-amp.

From Equation (2), above, the noise due to capacitors 461 and 462 can be reduced by reducing $C_{S2}$ and/or by increasing β. However, for reducing Cs2 without affecting the transfer function (Equation 1), the reference voltage VREF=REFP−REFM will have to be increased, which may not be possible due to supply voltage limitations.

Hence what is needed is a method and apparatus for reducing noise in a switched capacitor amplifier circuit sampling a reference voltage.

BRIEF DESCRIPTION OF THE DRAWINGS

The present invention will be described with reference to the accompanying drawings, which are described below briefly.

FIG. 3B is a circuit diagram illustrating the operation of the circuit of FIG. 3A in sampling phase in a prior embodiment.

FIG. 3C is a circuit diagram illustrating the operation of the circuit of FIG. 3A in hold phase in a prior embodiment.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An aspect of the present invention ensures that (substantially) equal common mode voltage is present at the input terminals of an operational amplifier (amplifying the residue signal in a stage of an ADC in two phases) while reducing the noise introduced into the amplified signal. Such a feature is obtained by using a first reference capacitor which is coupled between an input terminal of the operational amplifier and a reference voltage in a first phase, and between the input terminal and the reference voltage but with opposite polarity in the second phase.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Circuit

Figure 5A:
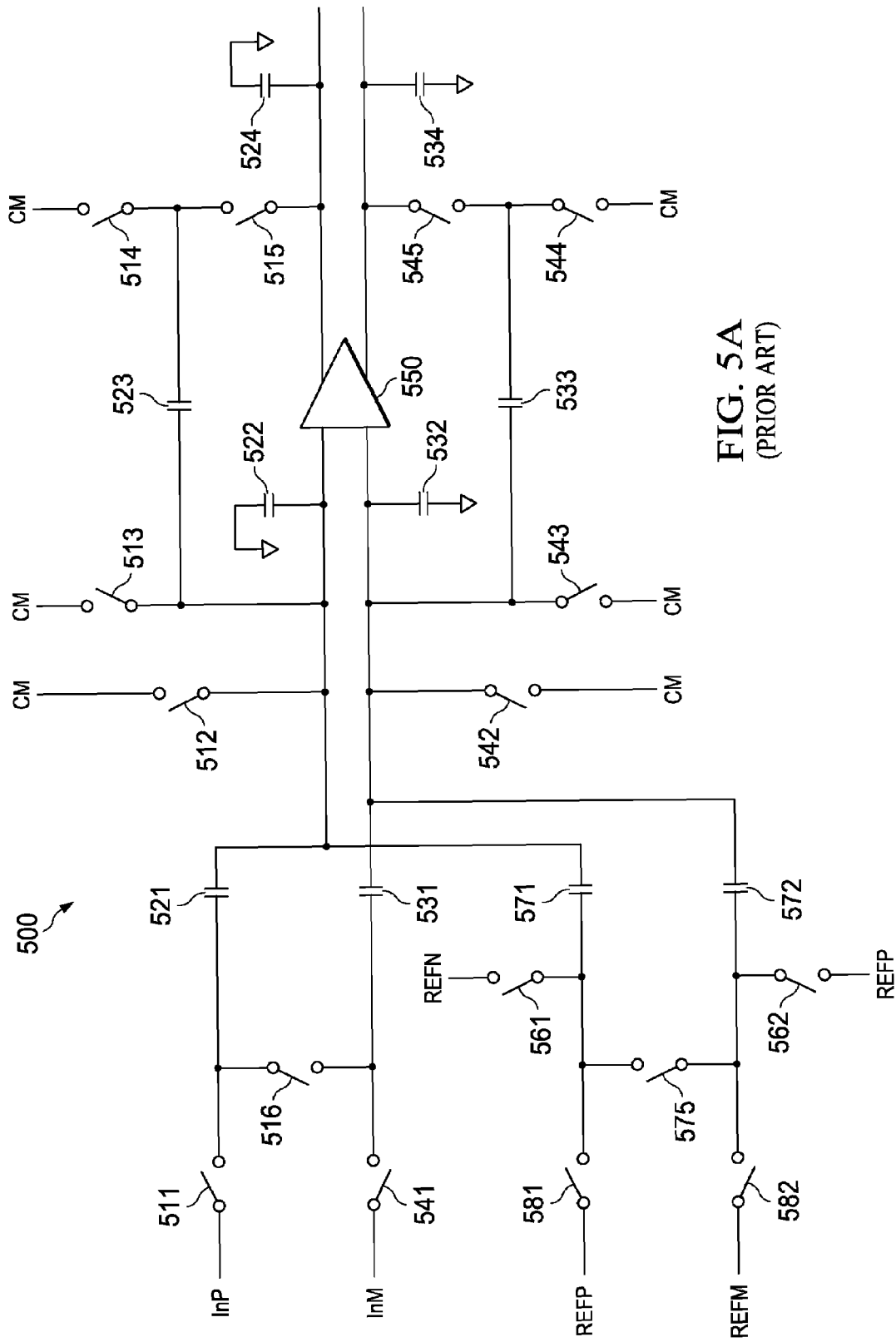
FIG. 5A is a circuit diagram representing an example switched capacitor amplifier implemented according to an aspect of the present invention.

FIG. 5A is a circuit diagram representing an example switched capacitor amplifier circuit implemented according to an aspect of the present invention. Switched capacitor amplifier circuit 500 is shown containing op-amp 550, capacitors 521-524, 531-534, 571 and 572, switches 511-516, 541-545, 561, 562, 581 and 582. The operation of the components is described below in further detail.

Figure 1:
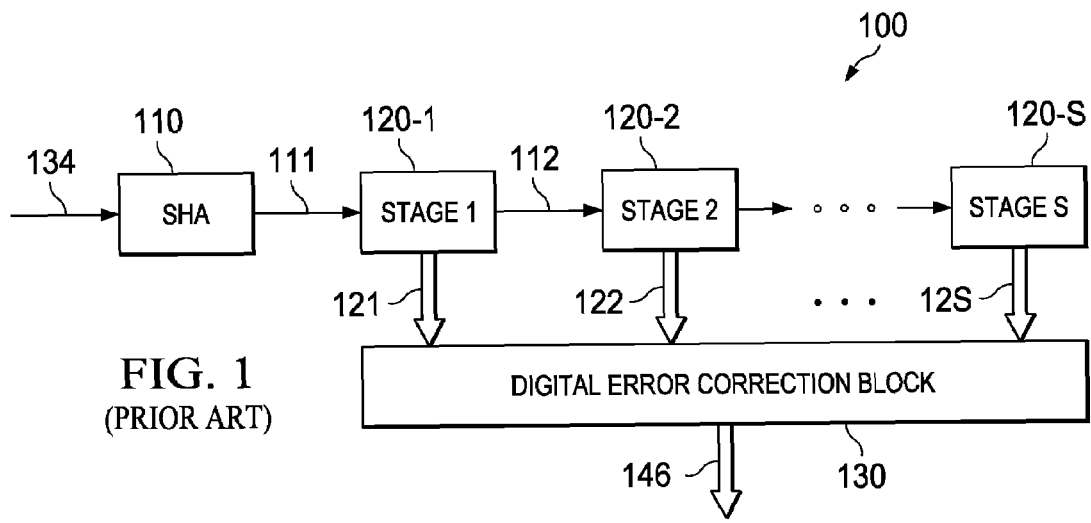
FIG. 1 is a block diagram of an example ADC implementing a switched capacitor amplifier according to a prior approach.
Figure 2:
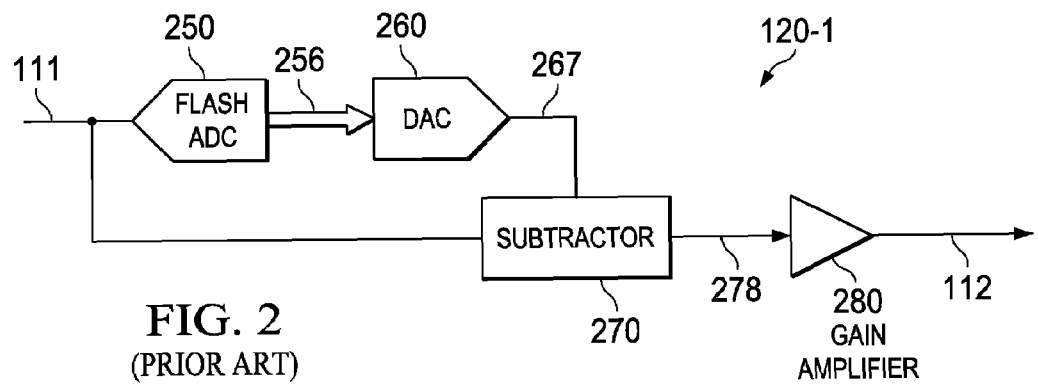
FIG. 2 is a block diagram illustrating the logical operation of each stage of a pipeline ADC according to a prior approach.
Figure 3D:
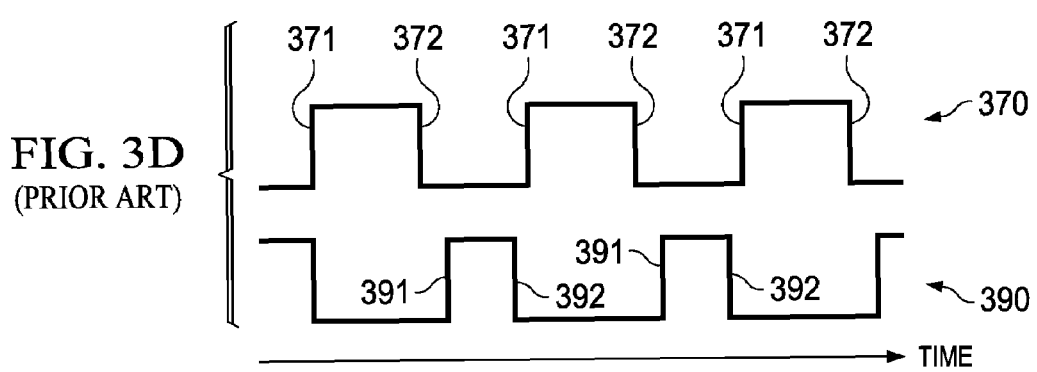
FIG. 3D is a timing diagram providing time reference for the two phases of operation of FIGS. 3B and 3C.
Figure 3A:
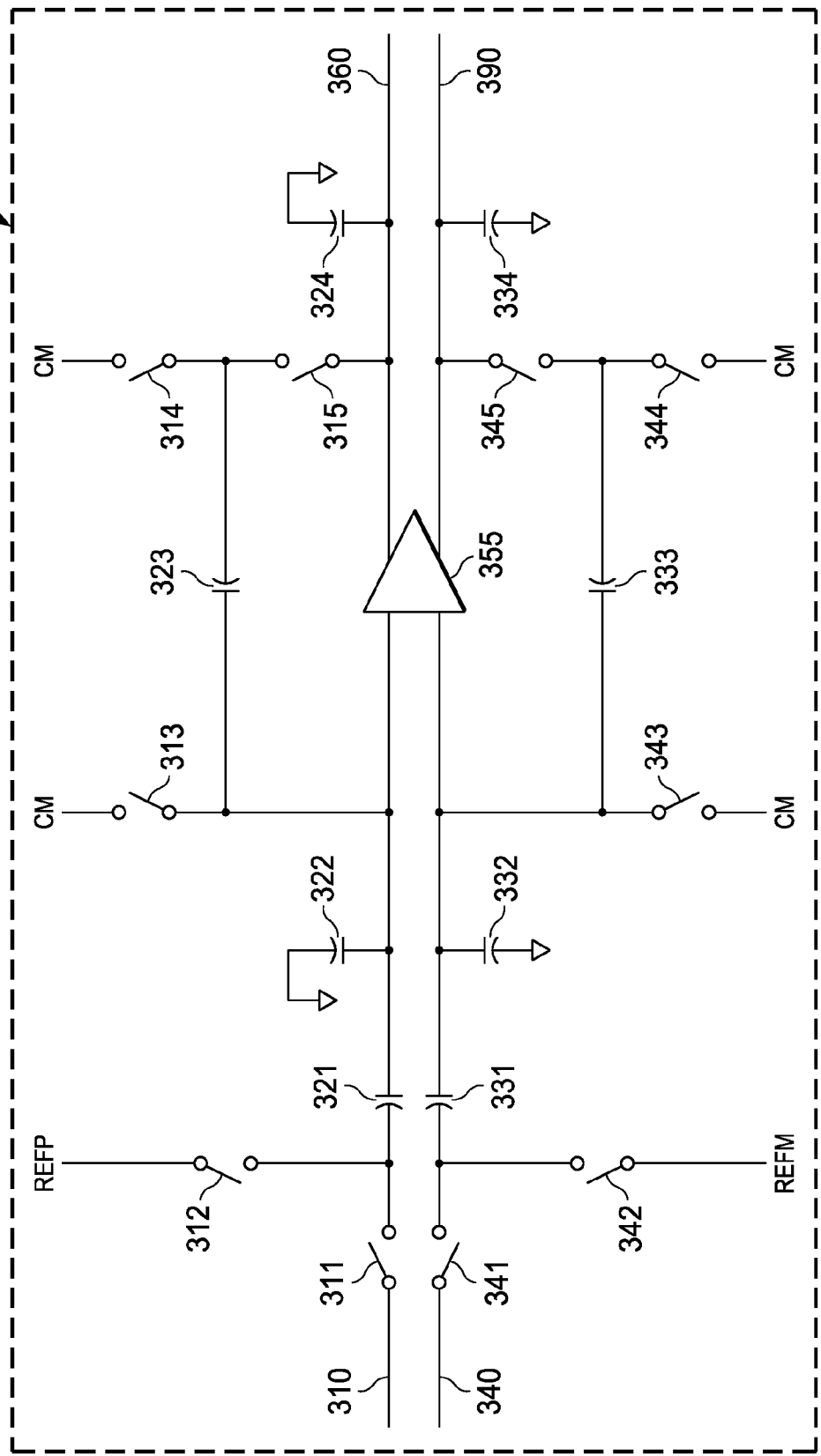
FIG. 3A is a circuit diagram of a prior switched capacitor amplifier implementing a substractor, DAC and gain amplifier of a stage.
Figure 4A:
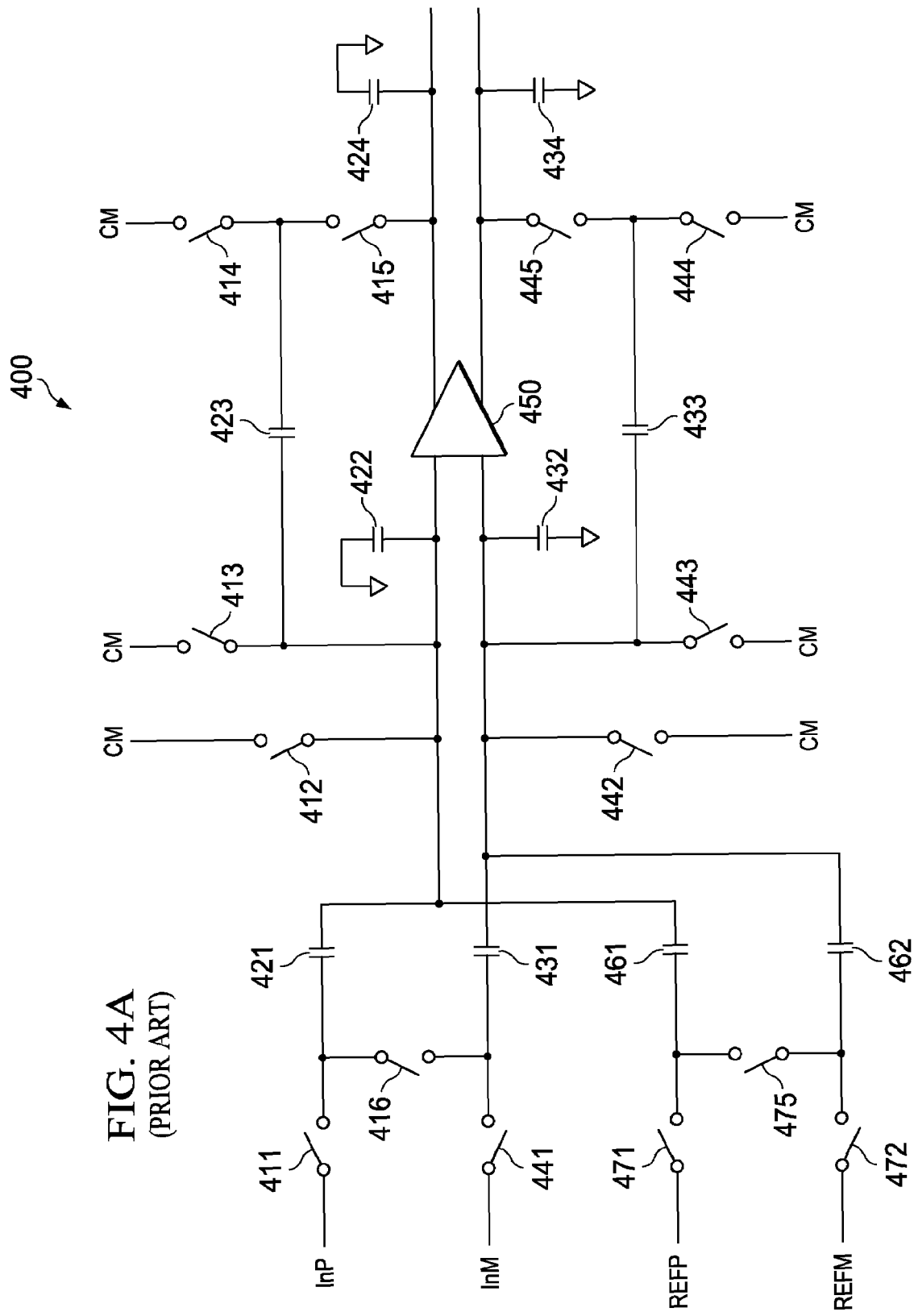
FIG. 4A is a circuit diagram of a prior switched capacitor amplifier, which samples the input signal and the reference signal together.
Figure 4B:
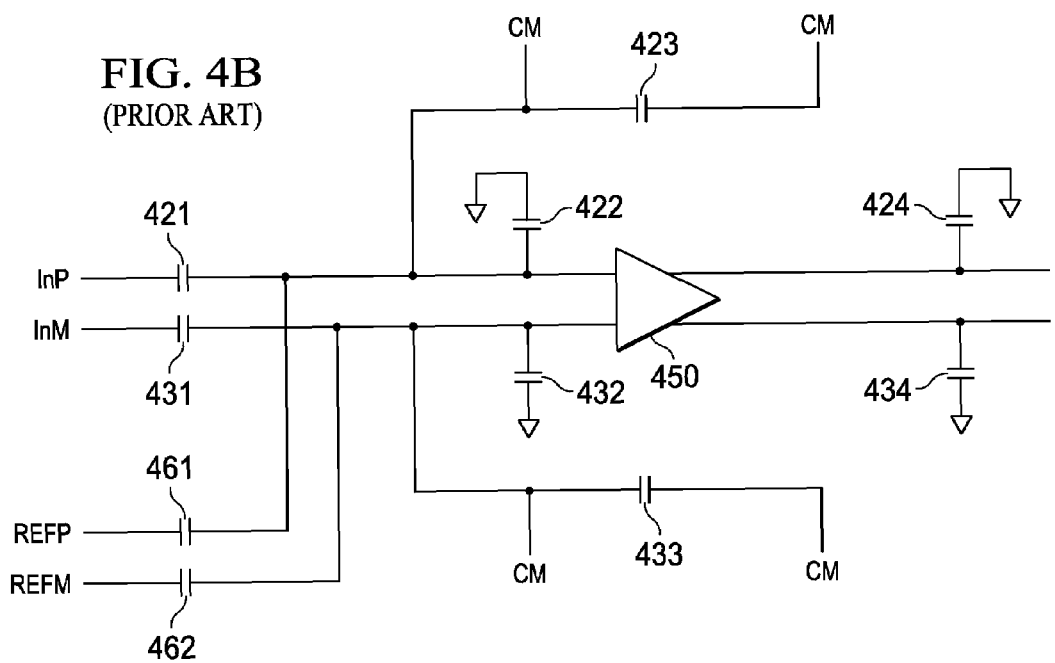
FIG. 4B is a circuit diagram illustrating the operation of the circuit of FIG. 4A in sampling phase in a prior embodiment.
Figure 4C:
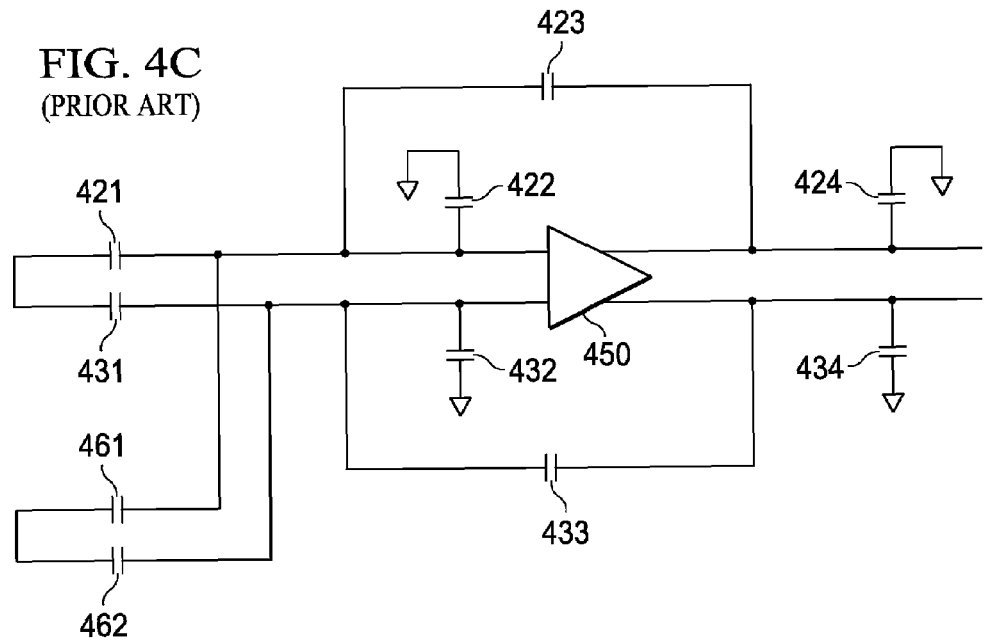
FIG. 4C is a circuit diagram illustrating the operation of the circuit of FIG. 4A in hold phase in a prior embodiment.

Similar to operation of circuit 400, circuit 500 operates in two phases according to clock signals 370 and 390 shown in FIG. 3D. Broadly, in phase 1 (sampling phase, between time points 371-372), each of capacitors 521 and 531 samples an input signal and each of capacitors 571 and 572 samples a reference signal. In phase 2 (hold phase, between time points 391-392), the difference (residue signal) of the sampled input voltage and the reference voltage is amplified. The desired operations in the two phases are obtained by operating various switches, as described below with reference to FIGS. 5B and 5C respectively.

Figure 5B:
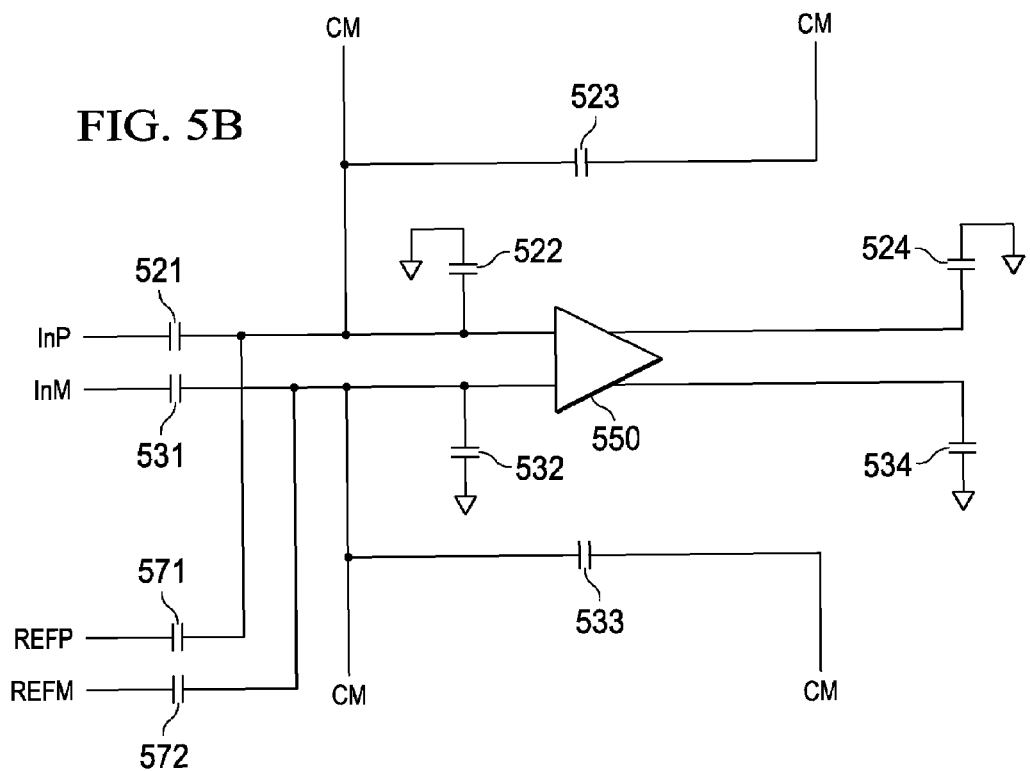
FIG. 5B is a circuit diagram illustrating the operation of the circuit of FIG. 5A in sampling phase in an embodiment of the present invention.

FIG. 5B is a circuit diagram depicting the operation of circuit 500 in phase 1 (371-372) in which switches 511, 581, 513, 514, 541, 582, 543 and 544 are closed (making contact) and switches 512, 515, 542, 545, 516, 561 and 562 are kept open. As a result, each of capacitors 521 and 531 is connected between the input signal and a common mode reference CM, each of capacitors 571 and 572 is connected between a reference voltage and the common mode voltage CM, and both the terminals of each of capacitors 523 and 533 are connected to common mode reference CM, as shown.

Due to such connections, each of capacitors 521 and 531 stores a charge proportionate to the sampled differential input signal, each of capacitors 571 and 572 stores a charge proportionate to the reference voltage (REFP and REFM), and each of capacitors 523 and 533 discharges any (residue) charge accumulated in the previous phase of operation.

Figure 5C:
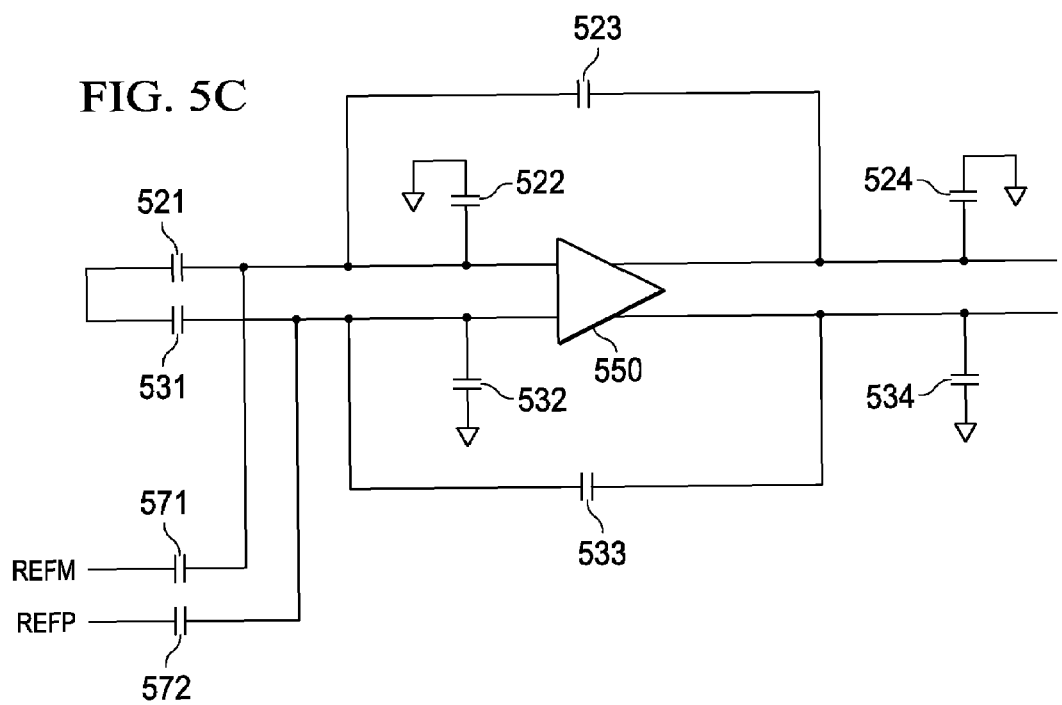
FIG. 5C is a circuit diagram illustrating the operation of the circuit of FIG. 5A in hold phase in an embodiment of the present invention.

FIG. 5C is a circuit diagram depicting the operation of circuit 500 in phase 2 (391-392) in which switches 512, 515, 542, 545, 516, 561 and 562 are closed (making contact) and switches 511, 581, 513, 514, 541, 582, 543 and 544 are kept open. Due to operation of switches 561 and 562, the terminals of capacitors 571 and 572 are connected to opposite reference voltages compared to the connections during phase 1 operation. As an illustration, capacitor 571 is connected to REFP in phase 1, but to REFM (opposite polarity of REFP) in phase 2.

As a result, charges stored in the capacitors 521, 571, 531 and 572 are transferred to feedback capacitors 523 and 533. The output voltage generated at the output of op-amp 450 due to opposite connection is given by:

$$Vout = Voutp - Voutm = \frac{Cs1}{Cf} \times (Vinp - Vinm) - 2\frac{Cs2}{Cf}(REFP - REFM) \qquad \text{Equation (4)}$$

wherein each of the terms of Equation (4) have been defined in Equation (1) above. Factor 2 in equation 4 is due to the operation of switches 561 and 562 connecting the capacitor terminals to opposite reference voltages.

It may be appreciated that capacitance value Cs2 may be reduced by half to obtain the output of the same magnitude of Equation 1. Such a reduction in the capacitance value reduces the noise contribution of the switched capacitor amplifier. The reduced noise measured at the input is given by:

$$N_{pl} = \frac{2KT}{C_{S1}} + \frac{2KT}{C_F} \times \left(\frac{C_F}{C_S}\right)^2 + \frac{4KT}{C_{S2}} \times \left(\frac{C_{S2}}{2C_{S1}}\right)^2 + \left(\frac{4}{3} \times (1+\alpha) \times \frac{KT}{C_L} \times \frac{1}{\beta} \times \frac{1}{G^2}\right) + 2 \times (VN_{REF})^2 \times \left(\frac{C_{S2}}{2C_{S1}}\right)^2 \quad \text{Eq (5)}$$

wherein each of the terms of Equation (5) has been defined in Equation (2) above. It may be appreciated that the factor 2 appearing in the denominator of a number of terms in equation 5 confirms the reduction in noise, as desired.

Further increase in the (β) feedback factor of op-amp is given by $$\beta = \frac{C_F}{C_{S1} + 0.5 \times C_{S2} + C_F + C_{PIN}} \quad \text{Eq (6)}$$

The increase in the feedback factor (β) further decreases the noise value of equation 5. From the description above, we can obtain the performance of Equation (1) by connecting capacitors 571 and 572, each having a value $C_{s2}/2$, thereby reducing the size and power consumption (in addition to noise) of ADCs.

The switched capacitor amplifier circuits (and ADCs containing such circuits) thus implemented can be used in several types of devices and systems. An example system in which such circuits are implemented is described below in further detail.

3. Device

Figure 6:
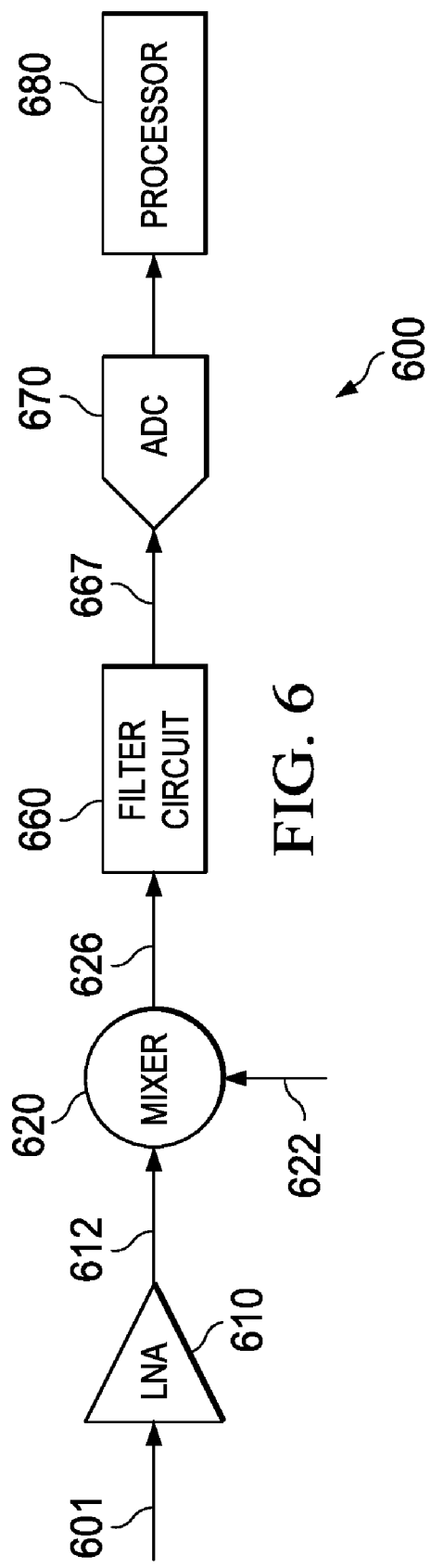
FIG. 6 is a block diagram of an example system/device in which various aspects of the present invention may be implemented.

FIG. 6 is a block diagram of receiver system 600 illustrating an example system in which various aspects of the present invention may be implemented. For illustration, it is assumed that receiver system 600 is implemented within a wireless receiver. However, receiver system 600 can be implemented in other devices (wireless as well as wire-based communications) also.

Receiver system 600 is shown containing low noise amplifiers (LNA) 610, mixer 620, filter circuit 660, analog to digital converter (ADC) 670, and processor 680. Each block/stage is described in further detail below.

LNA 610 receives signals on path 601 and amplifies the received signals to generate a corresponding amplified signal on path 612. For example, in wireless systems, the signals that are transmitted from satellites, etc., may be received by an antenna (not shown) and the received signals are provided on path 601. The received signals may be weak in strength and thus amplified by LNA 610 for further processing. LNA 610 may be implemented in a known way.

Mixer 620 may be used to down-convert the received amplified signal on path 612 into an intermediate signal with the frequency band of interest centered at a lower frequency than the carrier frequency of the received signal. In an embodiment, a signal with the frequency band of interest centered at 2.4 GHZ (carrier frequency) is converted to a signal with the frequency band of interest centered at zero frequency.

Mixer 620 may receive the amplified signal on path 612 and a signal of fixed frequency on path 622 as inputs, and provides the intermediate signal on path 626. The signal of fixed frequency on path 622 may be generated by a phase locked loop (not shown) in a known way.

Filter circuit 660 may correspond to a low pass filter, which allows the desired low frequencies and rejects all other unwanted high frequencies present in the signal received on line 626. The filtered signal, which contains the frequency band of interest, is provided on path 667.

ADC 670 converts (samples) the filtered signal received on path 667 to a corresponding digital value, which represents the signal of interest in received signal 601. Processor 680 processes the received digital values to provide various user applications and may be implemented as multiple processing units, each potentially operating independently. ADC 670 may be implemented according to various aspects of the present invention described in above sections.

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A switched capacitor amplifier circuit comprising:
   an operational amplifier having a first input terminal and a second input terminal;
   a first sampling capacitor being connected between an input signal and said first input terminal in a first phase; and
   a first reference capacitor being coupled between said first input terminal and a reference voltage in said first phase, said first reference capacitor being connected between said first input terminal and a non-zero voltage in a second phase.

2. The switched capacitor amplifier circuit of claim 1, wherein said non-zero voltage represents said reference voltage but with opposite polarity.

3. The switched capacitor amplifier circuit of claim 2, further comprising:
   a first feedback capacitor connected between said first input terminal and a first output terminal of said operational amplifier in said second phase,
   wherein said first sampling capacitor is connected between a common mode reference voltage and said first input terminal in said second phase,
   whereby the output (Vout) of said operational amplifier equals:

$$Vout = \frac{Cs1}{Cf} \times (Vinp - Vcm) - \frac{Cs2}{Cf}(V_{REF} - V_1)$$

wherein Cs1, Cs2 and Cf respectively represent the capacitance values of said first sampling capacitor, said first reference capacitor, and said first feedback capacitor, and Vinp, Vcm, Vref, and V1 respectively represent the voltage levels of said input signal, said common mode reference voltage, said reference voltage, and said non-zero voltage.

4. The switched capacitor amplifier circuit of claim 3, wherein Vcm is equal to 0 and V1 is equal to -Vref.

5. The switched capacitor amplifier circuit of claim 3, wherein said operational amplifier is operated in a differential mode, wherein Vref is equal to a difference between said reference voltage and said reference voltage with opposite polarity, V1 is equal to -Vref, and Vcm is equal to a common mode voltage of said input signal.

6. A device comprising:

a processor processing a plurality of digital values;

a switched capacitor amplifier circuit receiving an input signal and generating an amplified signal, each of said plurality of digital values being generated from said amplified signal, said switched capacitor amplifier circuit comprising:

an operational amplifier having a first input terminal and a second input terminal;

a first sampling capacitor being connected between an input signal and said first input terminal in a first phase; and a first reference capacitor being coupled between said first input terminal and a reference voltage in said first phase, said first reference capacitor being connected between said first input terminal and a non-zero voltage in a second phase.

7. The device of claim 6, wherein said non-zero voltage represents said reference voltage but with opposite polarity.

8. The device of claim 7, further comprising:

a first feedback capacitor connected between said first input terminal and a first output terminal of said operational amplifier in said second phase, wherein said first sampling capacitor is connected between a common mode reference voltage and said first input terminal in said second phase, whereby the output (Vout) of said operational amplifier equals:

$$Vout = \frac{Cs1}{Cf} \times (Vinp - Vcm) - \frac{Cs2}{Cf}(VREF - V1)$$

wherein Cs1, Cs2 and Cf respectively represent the capacitance values of said first sampling capacitor, said first reference capacitor, and said first feedback capacitor, and Vinp, Vcm, Vref, and V1 respectively represent the voltage levels of said input signal, said common mode reference voltage, said reference voltage, and said non-zero voltage.

9. The device of claim 8, wherein Vcm is equal to 0 and V1 is equal to -Vref.

10. The device of claim 8, wherein said operational amplifier is operated in a differential mode, wherein Vref is equal to a difference between said reference voltage and said reference voltage with opposite polarity, V1 is equal to -Vref, and Vcm is equal to a common mode voltage of said input signal.

11. The device of claim 6, wherein said switched capacitor amplifier circuit is comprised in a analog to digital converter (ADC).

12. The device of claim 11, further comprising:

a low noise amplifier receiving an external signal and generating an amplified signal;

a mixer down-converting said amplified signal using a carrier signal to generate a down-converted signal; and a filter circuit filtering undesired components from said down-converted signal to generate said input signal;

wherein said ADC converts said input signal into said plurality of digital values.

* * * * *